United States Patent
Kuhara et al.

(10) Patent No.: US 6,748,143 B2
(45) Date of Patent: Jun. 8, 2004

(54) OPTICAL TRANSCEIVER MODULE AND OPTICAL COMMUNICATIONS SYSTEM USING THE SAME

(75) Inventors: Yoshiki Kuhara, Osaka (JP); Akira Yamaguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/413,773

(22) Filed: Apr. 15, 2003

(65) Prior Publication Data

US 2003/0210866 A1 Nov. 13, 2003

(30) Foreign Application Priority Data

May 10, 2002 (JP) ........................................ 2002-135046

(51) Int. Cl.[7] .................................................. G02B 6/30
(52) U.S. Cl. .............................. 385/49; 385/88; 385/89; 385/93; 385/94
(58) Field of Search ....................... 385/14, 49, 88–89, 385/92–94

(56) References Cited

U.S. PATENT DOCUMENTS

| | | | | |
|---|---|---|---|---|
| 5,337,398 A | * | 8/1994 | Benzoni et al. | 385/90 |
| 6,318,908 B1 | * | 11/2001 | Nakanishi et al. | 385/89 |
| 6,374,021 B1 | * | 4/2002 | Nakanishi et al. | 385/49 |
| 6,434,308 B1 | * | 8/2002 | Trezza | 385/119 |
| 6,459,517 B1 | * | 10/2002 | Duncan et al. | 398/135 |

FOREIGN PATENT DOCUMENTS

| JP | 10093133 A | 4/1998 |
|---|---|---|
| JP | 11068705 A | 3/1999 |

* cited by examiner

*Primary Examiner*—Akm Enayet Ullah
*Assistant Examiner*—Jennifer Doan
(74) *Attorney, Agent, or Firm*—Fish & Richardson P.C.

(57) ABSTRACT

An optical transceiver module comprises a submodule having a Y-branching optical transmission line formed on a flat platform such that a leading end is exposed at the front surface and having an LD chip and a PD chip disposed at first and second trailing ends of the optical waveguide. The submodule is secured to the front surface of a pole of a metal stem, and a condenser lens and an end of an optical fiber are secured relative to the stem by a metal package member so that the optical fiber and the leading end of an optical waveguide can be optically coupled by the condenser lens. Transmission light from the LD is focused by the lens and can be sent out to the optical fiber, and reception light that has propagated through the optical fiber can be received by the PD. Thus, the optical transceiver module whose submodule is accommodated in a metal package is superior in reliability, durability, and airtightness.

16 Claims, 10 Drawing Sheets

FIRST EMBODIMENT

FIRST EMBODIMENT

FIG. 4

FIRST EMBODIMENT

FIG. 5

SECOND EMBODIMENT

OPTICAL TRANSCEIVER MODULE AND OPTICAL COMMUNICATIONS SYSTEM USING THE SAME

BACKGROUND OF THE INVENTION

1. Field of the Invention

The present invention relates to an optical transceiver module whose submodule is accommodated in a metal package and which can intercept noise, having a highly reliable long life, and an optical communications system using the same.

2. Description of the Related Art

Figure 1:
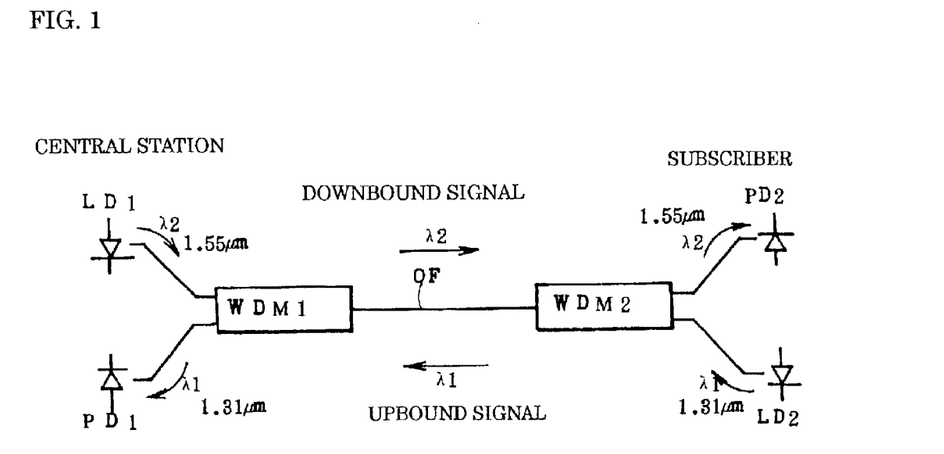
FIG. 1 shows a general structure of a single-fiber bi-directional optical communication system in which a central station and a subscriber are connected by an optical fiber.

FIG. 1 shows a general structure of a single-fiber bi-directional optical communications system, in which a central station and a subscriber are connected together by one optical fiber. At the central station, optical signals having a wavelength of $\lambda 2$ (1.55 μm) are generated by an LD 1 for providing to the subscriber. The optical signals are transmitted through a wavelength division multiplexer (WDM) 1 and is sent to an optical fiber OF. The optical signals transmitted through the optical fiber OF are subjected to wavelength division by a WDM 2 at the subscriber side, and the resulting signals enter and are received by a PD2 at the subscriber sides. These signals are a "downward signals" which are directed towards the subscribers from the central station and have a wavelength of $\lambda 2$.

On the other hand, at the subscriber side, signals for the central station are converted into optical signals having a wavelength of $\lambda 1$ (1.31 μm) by an LD 2, and the converted signals are sent to the optical fiber OF through the WDM 2. The WDM1 demultiplexes the optical signals having a wavelength of $\lambda 1$ and the resulting signals are directed to a PD 1, by which the signals are converted to electrical signals. These signals are "upward signals" directed towards the central station from the subscribers, and have a wavelength of $\lambda 1$. Since the wavelengths are different, it is possible to perform simultaneous bi-directional transmission. Obviously, ping-pong transmission can also be carried out. A WDM is provided at a branching portion of an optical transmission line (optical fiber, optical waveguide) and carries out wavelength selection.

An optical receiver module having a structure in which a light receiver device (photodiode (PD)), a lens, an optical fiber, etc., are disposed on an optical axis receives optical signals. In FIG. 1, the optical receiver modules are simply indicated as PD1 (central station side) and PD2 (subscriber side). An optical transmitting module having a structure in which a light emitting device (semiconductor laser, laser diode (LD)), a lens, and an optical fiber are disposed at the same optical axis generates optical signals.

The following types are actually and currently used as optical receiver modules. In one type, a PD chip is mounted to the top surface of a disk-shaped metal stem having lead pins protruding from the bottom surface, a cap holding a lens is secured to the stem, and a ferrule holding an end of an optical fiber is secured to the stem by a circular conical ferrule holder. In another type, a PD is attached to a metal stem, a cap having an opening is mounted to the stem, a circular cylindrical lens holder holding a lens is aligned with and secured at the outer side of the cap at the stem, a ferrule holding an end of an optical fiber is passed through a circular conical ferrule holder, and the ferrule holder is aligned with and secured on top of the lens holder.

Here, the lens is disposed at an axial line of the optical fiber, and the PD is disposed vertically on a line extending therefrom. Light exiting from the optical fiber propagates through space and is focused by the lens. The focused light enters the PD. Each type of optical receiver module is entirely enclosed by a metal package (stem, lens holder, and ferrule holder) by hermetic sealing, so it is highly airtight. Because moisture and oxygen do not enter the package, the PD chip, wiring, etc., do not deteriorate. Each type of optical receiver module is stringently enclosed by the metal package, so electromagnetic waves and light do not enter it, and therefore crosstalk is low. Each type of optical receiver module has been actually used for a long time, so it is highly reliable.

The optical transmitting module which is currently used is a metal-can-type package module which is accommodated in a similar metal package. In one type of optical transmitting module, a protrusion (called a "pole") is formed at a disk-shaped metal stem, a semiconductor laser is vertically attached to a side surface of the pole, a monitor photodiode (monitor PD) is mounted to a stem surface that is disposed directly below the semiconductor laser, a circular cylindrical cap having a lens is secured on top of the photodiode, a ferrule holding an end of an optical fiber is supported by a ferrule holder, and the ferrule holder is aligned with and secured to the stem.

In another type of optical transmitting module, a cap only having an opening is mounted to a surface of a stem, a circular cylindrical lens holder holding a lens is mounted to the top surface of the stem disposed at the outer side of the cap, a ferrule holding an end of an optical fiber is supported by a ferrule holder, and the ferrule holder is aligned with and secured on top of the lens holder. These types of optical transmitting modules each accommodated in a metal package are enclosed by hermetic sealing, so they are highly reliable, have a long life, and prevent the occurrence of crosstalk because they do not allow the flow of electromagnetic waves and light to and from the metal package. A metal-can-type optical transmitting module and an optical receiver module are provided, being branched out by optical fibers from the associated WDM shown in FIG. 1. Therefore, there are an optical fiber which connects each metal-can-type optical transmitting module and its associated WDM, and an optical fiber which connects each optical receiver module and its associated WDM. The transmitting device and the receiver device of each module are independent devices, and are connected to their respective WDMs through optical fibers.

These modules having three-dimensional shapes and being entirely enclosed by metal packages have been used, are highly reliable, and will be subsequently used in the future.

Figure 2:
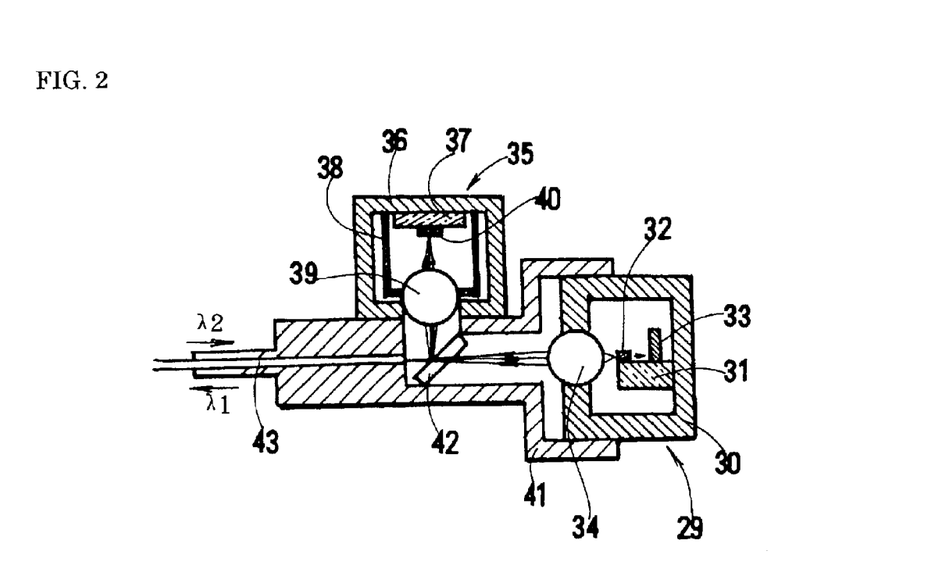
FIG. 2 is a sectional view of a structure disclosed in Japanese Patent No. 3167650 in which an optical transmitting module and an optical receiver module that are respectively accommodated in metal packages are combined into an integral unit.

Although, in the aforementioned description, an optical transmitting module and an optical receiver module are connected to a WDM by optical fibers, respectively, there are those integrally connected, such as disclosed in Japanese Patent No. 3167650, for example. A general structure thereof is shown in FIG. 2. A transmitting device 29 comprises an LD 32 and a monitor PD 33 mounted to a pole 31 inside a box metal package, and a condenser lens 34 provided in a front opening of the box package. A transmitting section is enclosed in the metal package by hermetic sealing and shielded from the outside. A receiver device 35 comprises a box metal package 36, a submount 37, a circular cylindrical cap 38, a condenser lens 39, and a PD chip 40.

These modules are independent modules, but are integrally formed by an integration metallic housing 41. The transmitting device 29 is welded and secured to an opening on an extension line from an axial line of the integration housing 41. The receiver device 35 is welded to the integration housing 41 so as to face a side opening of the integration housing 41. Light emitted from the LD 32 of the transmitting device 29 is focused by the condenser lens 34, and the focused light is transmitted through a WDM 42 and enters an optical fiber 43. The light that has propagated through the optical fiber 43 is reflected by the WDM 42, and the reflected light is transmitted through a condenser lens 39 from the side opening, and is incident upon and received by the PD chip 40.

In this manner, the independent transmitting device (optical transmitting module) and receiver device (optical receiver module), which are enclosed in metal packages, are integrally formed by the housing. However, these modules are still independent, separate modules. Therefore, these modules are nearly the same as a transmitting device and a receiver device that are connected to a WDM by optical fibers.

However, the extent to how small the optical transceiver module which have a metal package and a three-dimensional structure having an optical axis of an optical fiber in a direction of the normal to the stem can be made is limited because the metal packages have specific sizes. In addition, the extent of cost reduction is also limited. Even the special integrated optical transceiver module in FIG. 2 cannot reduce the volume, so this optical transceiver module is large in size and expensive.

A promising optical transmitting module and optical receiver module which are small and low cost are a surface-mount-type optical transmitting module and optical receiver module. These modules have a V-groove, an optical waveguide, etc. formed at an Si platform. A PD and an LD are mounted to the trailing ends thereof, and an optical fiber and the optical waveguide are abutted against them. The axial line of the optical fiber becomes parallel to a surface of the platform. Since the parts are mounted onto the Si platform having a V-groove or a mark, the parts can be easily positioned and mounting precision can be achieved even if time-consuming aligning is not carried out. A method for mounting parts which does not include an aligning operation is sometimes called "passive alignment." Since the optical fiber and the PD and LD are disposed close to each other, high optical coupling efficiency can be achieved.

In other words, a lens is not required. Since a lens is not used and the optical fiber and the PD and LD are disposed close to each other, the modules can be reduced in size. A plastic package in which the Si platform and a lead frame are plastic-molded together is used instead of a metal package, and therefore the module can be made light and small and reduced in cost.

In addition, a module can be designed to carry out both transmission and reception by forming an optical waveguide on the Si platform, with the LD being disposed at an end of the optical waveguide, a WDM being obliquely placed in the middle thereof, and the PD being disposed obliquely upward from the WDM. This type of module is called an optical transceiver (LD/PD) module.

As mentioned above, a surface-mount-type optical receiver module and a surface-mount-type optical transmitting module have many advantages. However, for applications in harsh environments, there is a persistent desire to enclose the optical elements in metal packages by hermetic sealing because hermetic sealing makes the metal packages highly air-tight.

An optical receiver module having only an optical receiver device (PD) mounted in a metal-can-type package is available and is currently in use. An optical transmitting module having only an LD or an LD and a monitor PD mounted in a metal package is often used with this type of optical receiver module.

SUMMARY OF THE INVENTION

Accordingly, it is an object of the present invention to provide a metal-package-type optical transceiver module which makes use of features of a surface-mount type and which makes it possible to perform hermetic sealing.

According to one aspect of the present invention, an optical transceiver module comprises: a submodule comprising a platform, a Y-branching optical waveguide disposed thereon, a light receiver device, and a light emitting device, the Y-branching optical waveguide having wavelength selectivity, with its leading end exposed at the front surface of the platform and two trailing ends c and d thereof being branched at a branching portion, for separating wavelengths into a first wavelength $\lambda 1$ and a second wavelength $\lambda 2$, the light receiver device for receiving the second wavelength $\lambda 2$ being disposed on the platform so as to oppose and to be close to a first trailing end of the optical waveguide, the light emitting device for generating the first wavelength being disposed on the platform so as to oppose and to be close to a second trailing end of the optical waveguide; a plurality of lead pins extending in an axial direction; a disk-shaped metal stem having an upwardly protruding pole, the stem holding the submodule at a surface of the pole; an optical fiber whose end is secured relative to the stem; a lens for optically coupling the optical fiber and the leading end of the Y-branching optical waveguide; a cap secured on the stem and holding the lens; and a supporting member secured to the stem and holding the optical fiber.

An optical transceiver module according to another aspect of the present invention comprises: a submodule comprising a platform, a waveguide disposed on the platform with the leading end "e" thereof being exposed at the front surface of the platform, a groove disposed in the middle of the waveguide, a multiple layer filter inserted in the groove and having wavelength selectivity for transmitting a first wavelength $\lambda 1$ and reflecting a second wavelength $\lambda 2$, a light receiver device, which is disposed above the platform so as to be close to and to oppose the multiple layer filter and receives the second wavelength $\lambda 2$, and a light emitting device, which is disposed on the platform so as to be close to and to oppose the trailing end "f" of the optical waveguide and generates the first wavelength $\lambda 1$; a plurality of lead pins extending in an axial direction; a disk-shaped metal stem having an upwardly protruding pole for holding the submodule at a surface thereof; an optical fiber whose end is secured relative to the stem; a lens for optically coupling the optical fiber and the leading end "e" of the optical waveguide; a cap secured to the stem and holding the lens; and a supporting member secured to the stem and holding the optical fiber.

The optical transceiver module of the present invention provides the following advantages.

In contrast with a conventional module, which is either a transmitting device or a receiver device because a metal package can only accommodate either a light receiver device or a light emitting device, in the present invention, both of these elements can be accommodated in a metal package such that the module is an optical transceiver module, since a submodule comprising a Y-branching optical transmission line provided on the Si platform and a light emitting device (LD) and a light receiver device (PD) disposed at the trailing ends of the transmission line can be accommodated in the metal package.

Thus, the module is an optical transceiver module, and nevertheless it can exhibit the same long-lasting reliability as a conventional optical receiver module or optical transmitting module that is accommodated in a metal package, since the package is durable and has a good record of performance. An axially symmetrical submodule is used, which facilitates alignment with the optical fiber and the lens. The optical transceiver module has fewer parts, is smaller, and is lower in cost compared to the optical receiver module and optical transmitting module that are separately provided in metal packages. Since the module is downsized, it can be advantageously used as an optical transceiver module at a station side.

DESCRIPTION OF THE PREFERRED EMBODIMENTS

In an optical transceiver module of the present invention, a submodule in which a light receiving device (PD) and a light emitting device (LD) are, separately mounted at the trailing ends of a Y-branching optical waveguide having wavelength selectivity and disposed on a platform is secured to the front surface of a pole of a metal stem having lead pins and the pole, a cap holding a lens is axially aligned and secured to the stem, a ferrule holding an end of a fiber is supported by a ferrule holder that is axially aligned and secured to the stem.

In another embodiment of the present invention, an optical transceiver module comprises: a submodule in which a light emitting device (LD) disposed at the terminal end of an optical waveguide on a platform and an optical receiver device (PD) mounted above a multiple layer having wavelength selectivity and inserted in an oblique groove disposed in the middle of the optical waveguide are separately mounted and which is secured to the front surface of a pole of a metal stem having lead pins and the pole; a cap which holds a lens and is axially aligned and secured to the stem; a ferrule which holds an end of a fiber and is supported by a ferrule holder which is axially aligned and secured to the stem.

(1) Alignment

Aligning is carried out so that a desired optical coupling efficiency is provided between an end surface of an optical fiber and a leading end of the optical waveguide. The alignment of the cap and the alignment of the ferrule holder are carried out two-dimensionally. The ferrule is aligned with the ferrule holder in the axial direction. Although such aligning operations need to be actively carried out, aligning operations which have conventionally needed to be carried out for two separately provided transmitting device and the receiver device are halved, and hence labor and cost for the aligning operations are halved compared to those of the conventional two separately provided modules.

(2) Platform

A platform is required for forming a submodule. If dimensional precision is strongly demanded, an Si bench formed of monocrystalline Si is used. However, if the platform only needs to have insulating property, and to be smooth and rigid, a ceramic platform may be used. Alternatively, an organic material, such as liquid crystal polymer, may be used for the platform.

(3) Y-branching Optical Waveguide

Figure 6:
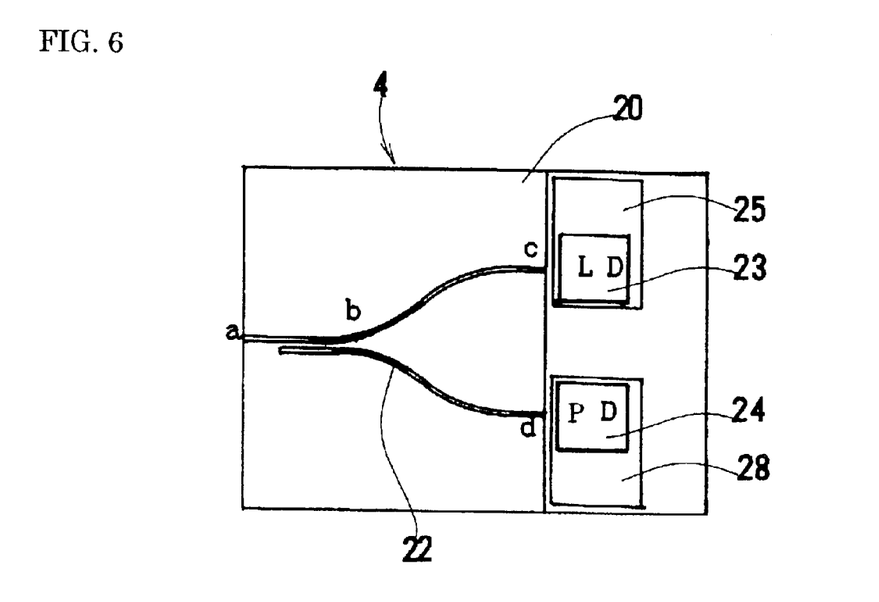
FIG. 6 is a plan view of a submodule in which a Y-branching optical waveguide is provided on an Si platform and an LD and a PD are disposed at the trailing ends of the optical waveguide such that the submodule can be mounted to a pole of a metal stem.

An optical waveguide is provided on a surface of the platform so as to be symmetrical on the left and right sides. The optical waveguide is a Y-branching optical waveguide, which not only has a Y-branching portion but also has wavelength selectivity. It needs to have a wavelength selectivity that allows a wavelength of λ1 (1.31 μm) to be transmitted through the right side and a wavelength of λ2 (1.55 μm) to be transmitted through the left side, for example. A Mach-Zehnder interferometer wavelength division multiplexer is shown in FIG. 6. Wavelength selectivity is provided by the distance between the two portions of the waveguide and the lengths of nearby parallel portions. The Y-branching portion may be a simple Y-shaped branching portion which divides power into halves into the two waveguide portions. In this case, it is necessary to insert a WDM into a branching portion b for providing wavelength selectivity.

In another structure used in the present invention, the wavelength selectivity which has been described in relation to the Y-shaped branching portion is provided by the multiple layer filter. In this case, the multiple layer filter is primarily formed using thin dielectric films having different refractive indices.

(4) Optical Waveguide

The waveguide formed on the Si platform may be a Ge—$SiO_2$/$SiO_2$ waveguide. For example, an $SiO_2$ layer (under-clad layer) is formed on the Si platform by sputtering or CVD, and a Ge-doped $SiO_2$ layer is formed on top of the $SiO_2$ layer for etching, so that a core is formed. An $SiO_2$ layer (over-clad layer) is formed on top of this. The clad layer has a thickness of 10 μm, and the cross-section of the core is 6 μm square, for example. The optical waveguide may be formed of an organic material such as polymer. For example, it may be formed of fluorinated polyimide. It may be formed on various types of platforms, such an Si platform, a ceramic platform, or a plastic platform.

(5) Light Receiver Device

A light receiver device may be an ordinary pin photodiode (pin-PD) since it receives optical signals. A light receiver layer is an InGaAs ternary element mixed crystal layer or an InGaAsP quaternary element mixed crystal layer. The light receiver device at a subscriber side receives light having a wavelength of 1.55 μm (λ2), and is insensitive to light having a wavelength of 1.31 μm. For example, a light absorbing plate for absorbing light with a wavelength of 1.31 μm is disposed just in front of the PD. Alternatively, a light absorbing layer for absorbing light with a wavelength of 1.31 μm may be disposed in the PD itself. Since the light receiver device is mounted at a trailing end of the optical waveguide, the PD is formed such that light is allowed to enter from an edge. This is called an edge illuminated type PD. There are a waveguide edge illuminated type PD in which a light receiver layer is disposed immediately above the waveguide; an upwardly refractive edge illuminated type PD in which an edge is obliquely cut, horizontal incident light is refracted upward, and the refracted light is guided to a light receiver layer; and a middle reflective edge illuminated type PD in which a wedge-like cutaway portion is provided in the center of the lower surface of a platform, and incident light from an edge is reflected upward by the wedge-like cutaway portion. All of these will be called edge illuminated type PD.

Another structure according to the present invention uses a rear-illuminated type PD that allows light to be incident thereupon from the back surface of a platform in order to receive light reflected by the multi-layer filter.

(6) Light Emitting Device

A light emitting device generates optical signals. It is either a semiconductor laser (LD) or a light emitting diode (LED). When a surface emission LED is used, it must be mounted to the platform horizontally. The light emitting device is designed such that it generates light having a wavelength of 1.31 μm (λ1) at the subscriber side, whereas it generates light having a wavelength of 1.55 μm (λ2) at a station.

(7) Application to a Pig Tail Type

Since the device of the present invention only needs to comprise a stem, a pole, a submodule, a lens, and a fiber, the present invention may be applied to a pig-tail-type optical transceiver module. In the case of the pig tail type, a trailing end of an optical fiber is secured by a ferrule, and an external optical connector is separately provided. The appearance of a combination of the module and the optical connector resembles a pig tail, and therefore this type of module is called a pig-tail-type module.

(8) Application to a Receptacle Type

Since the device of the present invention only needs to comprise a stem, a pole, a submodule, a lens, and an optical fiber, the present invention may be applied to a pluggable receptacle-type optical transceiver module. In the case of the receptacle type, a connector attached to an end of an external optical fiber and a connector of the optical transceiver module can be directly connected and disconnected. A dummy optical fiber is provided on an extension line of the submodule and the lens.

(9) Addition of Peripheral Circuits

In a transmitting section, in addition to the LD, a light receiver device for monitoring power of the LD (monitor PD, MPD) may be provided on the same platform. By this means, it is possible to maintain output from the LD at a specified level.

In a receiver section, in addition to the PD, an amplifier IC (AMP) for preliminarily amplifying a photocurrent of the PD may be provided directly behind the PD on the same platform.

(10) Application to an Optical Communications System

Since the optical transceiver modules of the present invention comprise a transmitting device and a receiver device that are accommodated in one metal package, they can be used in a wavelength division multiplexing bi-directional simultaneous optical communications system by disposing them at the station and the subscriber side and connecting corresponding modules with one optical fiber, respectively. Such use of the optical transceiver modules of the present invention will further promote widespread use of optical communications since the volume thereof is halved and costs are reduced as compared with conventional modules.

Figure 3:
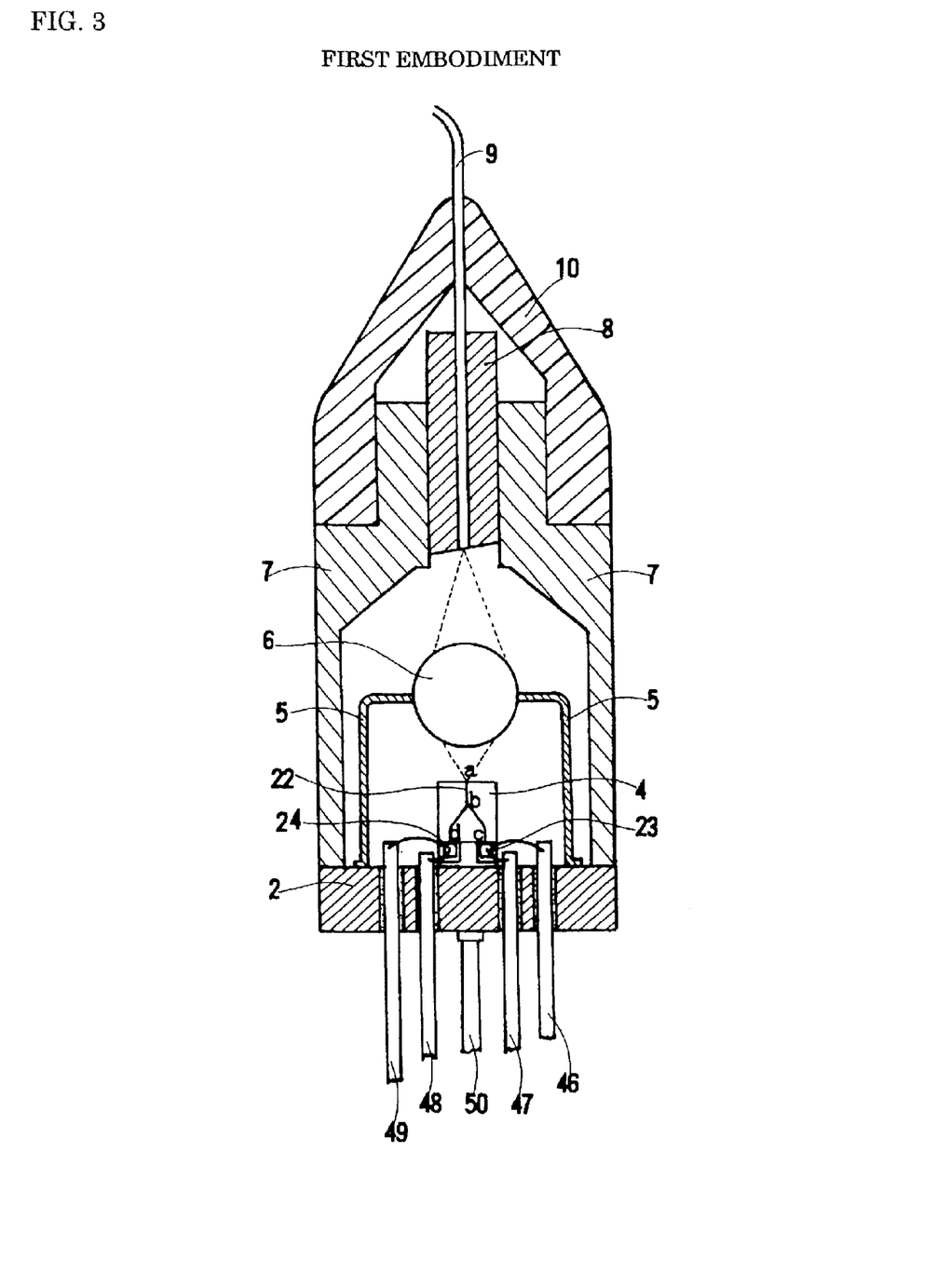
FIG. 3 is a vertical front cross-sectional view of an optical transceiver module of a first embodiment of the present invention.
Figure 4:
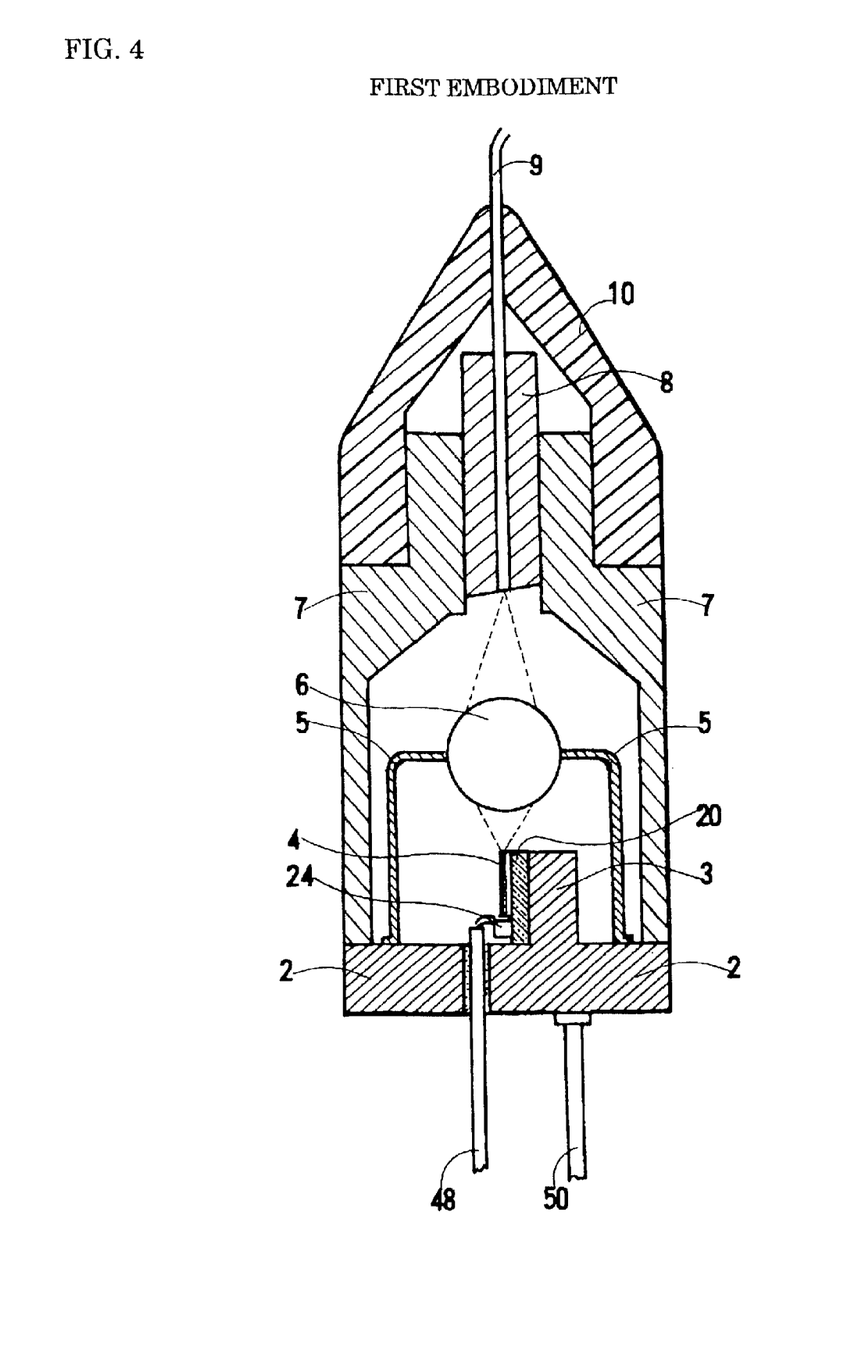
FIG. 4 is a vertical side cross-sectional view of the optical transceiver module of the first embodiment of the present invention.

1. First Embodiment (Pig Tail Type; FIGS. 3 and 4)

The first embodiment of the present invention will be described with reference to FIG. 3 (a vertical cross-sectional front view) and FIG. 4 (a vertical cross-sectional side view). A disk-shaped metal stem 2 has vertically extending lead pins and a pole (protrusion) 3 which protrudes from the top surface of the stem 2. In this embodiment, the stem has a diameter of 5.6 mm. The stem is formed of, for example, phosphor bronze, stainless steel, or Kovar (trademark). The stem 2 has five lead pins 46 to 50. Each lead pin has a diameter of, for example, 0.45 mm.

A submodule 4 comprising a Y-branching optical waveguide and a transmitting section and a receiver section is secured to a side surface of the pole 3 so that its axial line is oriented vertically. The internal structure of the submodule will be described later. A circular cylindrical metal cap 5 has a condenser lens 6 at a top open portion thereof. The condenser lens is, for example, a spherical lens and is formed of BK7 glass. Obviously, the condenser lens may be a spherical lens or an aspherical lens.

The bottom portion of the metal cap 5 is axially aligned and secured to the stem 2. At this stage, the submodule, which is sensitive to external electrical noise and moisture, is completely hermetically sealed. A circular cylindrical, metal ferrule holder 7 is provided such that it surrounds the outer side of the cap 5. A circular cylindrical ferrule 8 holds an end portion of an optical fiber 9. The end portion is often ground at an oblique angle from 4 to 12 degrees. The ferrule 8 is inserted into an axial hole of the ferrule holder 7, and is moved forward and backward in an axial direction (z direction) to align it. Alignment is carried out at an xy plane of the ferrule holder 7, and the optimum position is determined to secure the ferrule holder 7 to the stem 2. A flexible bend limiter 10 is inserted to the outer side of the upper portion of the ferrule holder 7 in order to prevent excessive bending of the optical fiber 9. Alignment is carried out so that a desired optical coupling efficiency can be provided between an end face of the optical fiber and a leading end a of the optical waveguide.

Reception light having a wavelength of $\lambda 2$ that has propagated through the optical fiber 9 exits from the optical fiber 9, is focused by the lens 6, and enters the leading end a of an optical waveguide 22 formed on the Si bench of the submodule 4. The reception light having a wavelength of $\lambda 2$ is selectively distributed at a branching portion b towards d (moves from b to d) and is incident upon a PD 24.

Transmission light having a wavelength of $\lambda 1$ that has been generated at an LD 23 enters the optical waveguide 22 and moves through the optical waveguide from c to b to a. The transmission light that has exited from the leading end a of the optical waveguide 22 is focused by the lens 6 and enters the end surface of the optical fiber 9. Then, the light propagates through the optical fiber 9. However, since the module is a pig-tail-type module, an optical connector exists close-by, whereat the optical fiber 9 can be connected to an external optical fiber.

2. Second Embodiment (Receptacle Type, FIG. 5)

Figure 5:
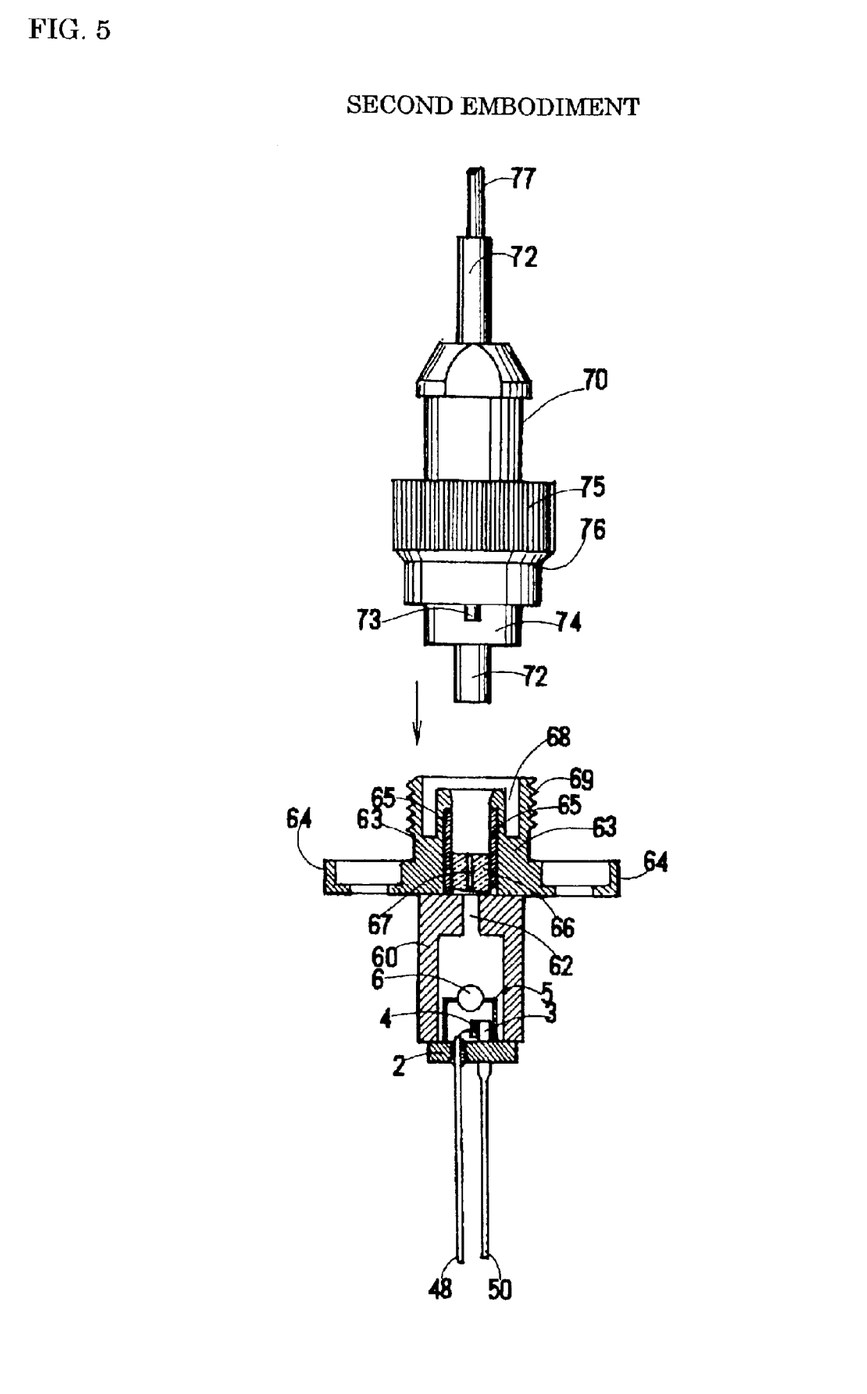
FIG. 5 is a vertical front view of an optical transceiver module of a second embodiment of the present invention.

The present invention may also be applied to a receptacle-type optical transceiver module as shown in FIG. 5. A submodule 4 is the same as the submodule 4 in the first embodiment (FIGS. 3 and 4; pig tail type) in that the submodule 4 is secured to a pole 3 of a disk-shaped metal stem 2 and that, above this, a lens 6 is held by a cap 5. At the outer side of the cap 5, a circular cylindrical metal sleeve 60 is axially aligned and secured to the top surface of the stem 2. The top portion of the sleeve 60 has an axial opening 62. A disk-shaped housing 63 having a center hole is welded to the top surface of the sleeve 60. The housing 63 has a horizontally extending disk-shaped flange 64. The flange 64 is secured by a screw.

A circular cylindrical sleeve 65 having excellent wear resistance is embedded in the center hole of the housing 63. This is because a ferrule is inserted and removed many times. A stub 66 having an outside diameter equal to the inside diameter of the sleeve 65 is inserted at the lowest point of the sleeve 65. The stub 66 holds a dummy optical fiber 67. The lower end of the dummy optical fiber 67 is ground obliquely in order to prevent reflected light from returning to an LD. A ferrule 72 of a connector at the other side is inserted in a portion above the dummy optical fiber 67 of the sleeve 65. An annular recess groove 68 is formed at the outer side of the center hole. An externally threaded rod-shaped portion 69 is formed at the outer side of the recess groove 68.

An optical connector 70 at the other side is a male optical connector having a structure which allows it to be mounted to and removed from the housing 63. The circular cylindrical metal ferrule 72 is inserted in the center of the optical connector 70. A guide pin 73 for positioning the optical connector 70 protrudes from the front end of the optical connector 70. A circular cylindrical collar 74 is disposed between the ferrule 72 and the guide pin 73. The ferrule 72 and the collar 74 are integrally formed. A cap nut 76 having a knurled portion 75 is disposed at the outer side of the collar 74. The ferrule 72 extends from front to back of the connector 70, and firmly holds an end of an optical fiber 77.

In order to connect the optical connector 70 to the housing (receptacle) 63, the ferrule 72 is inserted into a hole of the sleeve 65 at the housing 63. The collar 74 is fitted to the recess groove 68. The guide pin 73 is fitted to a hole (not shown) of the housing 63, and is positioned in the circumferential direction. The front end of the ferrule 72 contacts the stub 66 and the dummy optical fiber 67. By turning the cap nut 76 rightwards, it can be screwed to the externally threaded rod-like portion 69. Thus, the external optical fiber 77, the dummy optical fiber 67, the opening 62, the lens 63, and the submodule 4 are disposed side by side on the optical axis. The structure of the submodule is the same for the first embodiment (pig tail type) and the second embodiment. The structure of the engaging portion of the receptacle may be such that a pole or a pin is fitted.

3. Structure of Submodule (FIGS. 6 to 8)

Figure 7:
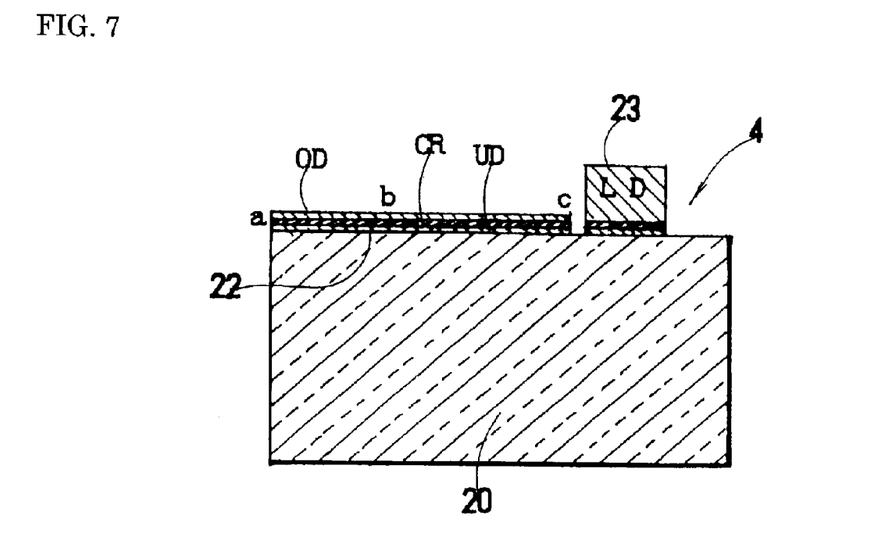
FIG. 7 is a sectional view of the submodule having the structure shown in FIG. 6.
Figure 8:
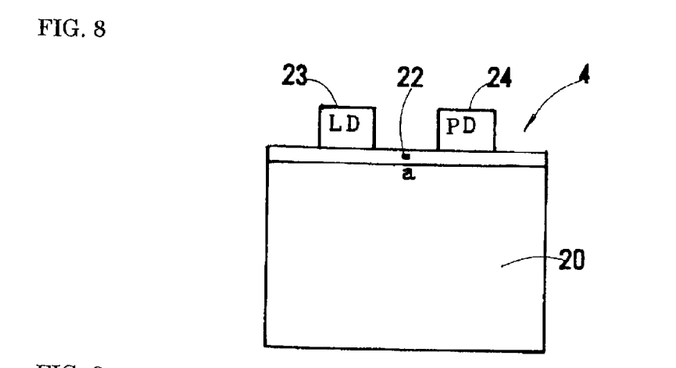
FIG. 8 is a front view of the submodule having the structure shown in FIG. 6.

FIGS. 6 to 8 are, respectively, a plan view, a vertical cross-sectional side view, and a cross-sectional front view of the structure of a submodule 4 comprising a Y-branching optical waveguide, a receiver section, and a transmitting section. An Si platform, a ceramic platform, or a plastic platform may be used as a platform. In this example, an Si platform having a length of 2.0 mm, a width of 1.5 mm, and a thickness of 1.0 mm is used. A Y-branching optical waveguide 22 is provided on the top surface of a rectangular Si bench 20. The Y-branching optical waveguide 22 may be an optical waveguide formed of inorganic materials comprising an $SiO_2$ under-clad layer UD, a Ge-doped $SiO_2$ core CR, and an $SiO_2$ over-clad layer OD, or an optical waveguide (UD/CR/OD) formed of an organic material comprising polymer.

In either case, the Y-branching optical waveguide 22 has a leading end a, a branching portion b, a first trailing end c, and a second trailing end d. The leading end a is exposed at the center of the front end of the Si bench 20 (see FIG. 8). The leading end a is a portion that is optically coupled with an optical fiber by a lens. In other words, an aligning operation is carried out so that transmission light and reception light can, by the lens, be combined between the optical fiber and the leading end a with a desired efficiency.

The branching portion b of the optical waveguide 22 is a Mach-Zehnder interferometer wavelength division multiplexer (WDM). The branching portion b separates light having a wavelength of 1.31 $\mu$m and light having a wavelength of 1.55 $\mu$m. The length of the common portion of and distances between the two portions of the optical waveguide enable the optical waveguide to exhibit such wavelength selectivity. The light having a wavelength of 1.31 $\mu$m moves from c to b to a. The light having a wavelength of 1.55 $\mu$m moves from a to b to d. Such a wavelength selectivity is reversible. The light having a wavelength of 1.31 µm may move from a to b to c. The light having a wavelength of 1.55 µm may move from d to b to a.

Beyond the first trailing end c, an LD 23 is secured to a metallized pattern 25 on the Si platform 20 such that the epitaxial face is downward (stripe is at the lower side; a p-electrode is disposed below, while an n-electrode is disposed at the upper surface). The LD 23 generates transmission light having a wavelength of λ1 (1.31 µm). A lens is not provided because the first trailing end c and the LD 23 are disposed close to each other. The LD 23 and the path b to c of the optical waveguide form the transmitting section. In this example, the LD 23 used has a size of 300 µm×300 µm×150 µm. A buffer layer, a light emitting section, a contact layer, the electrodes, etc., are provided on an InP platform. The light emitting section is formed of an InGaAsP material and generates light having a wavelength of 1.31 µm.

Beyond the second trailing end d, an edge illuminated type PD 24 is secured to a metallized pattern 28 on the Si platform 20 also in a manner such that epitaxial face is downward (a p-electrode is disposed below, while an n-electrode is disposed above). A lens is also not provided between the PD 24 and the trailing end d. They are sufficiently close to each other, allowing adequate light to enter the PD 24 without lens. The PD 24 and the path b to d of the optical waveguide form a light receiver section. For the edge illuminated type, there are a wave-guide edge illuminated type and a refractive edge illuminated type, and reception light enters from an edge and is guided to the light receiver section.

The size of the PD 24 used in this example is 300 µm×300 µm×150 µm. A light receiver layer, the electrodes, etc., are provided on the InP platform. The light receiver layer is formed of InGaAs, which is sensitive to light having a wavelength of 1.31 µm as well as light having a wavelength of 1.55 µm, and designed to receive light having a wavelength of 1.55 µm.

It is a feature of the present invention that the light transmitting section (LD 23 and path b to c of the optical waveguide) and the light receiver section (PD 24 and path b to d of the optical waveguide) are provided on the same platform.

In a surface-mount type, it is not rare for a Y-branching portion to be provided on an Si platform, with an LD and a PD being provided at their respective trailing ends. In the present invention, in a metal package module, an Si platform having a Y-branching optical waveguide provided thereon is mounted to a pole of a stem. Providing a Y-branching optical waveguide on an Si platform, and vertically mounting a submodule having an LD and a PD to a pole of a metal stem are completely novel features. While the module of the present invention is similar to a surface-mount type in that an Si platform is used, the submodule in enclosed in a metal package by hermetic sealing, so the module is a combination of the surface-mount type and package type. Therefore, the present invention provides the advantages of both types. Since hermetical sealing is applied, the module will not be deteriorated due to the entry of moisture and oxygen. Since a metal package is used, electromagnetic noise does not enter from the outside, so it is durable, strong, highly reliable, and has long life.

Since the submodule 4 comprises an Si platform, an optical waveguide, an LD, and a PD, it is a small component part, so it can be produced by a separate process, as shown in FIGS. 6 and 7. Since a metal stem having a pole already has actually been applied in an LD module, the mounting of the submodule 4 instead of an LD to the side surface of the pole can be achieved by slightly changing the related assembly process.

Figure 9:
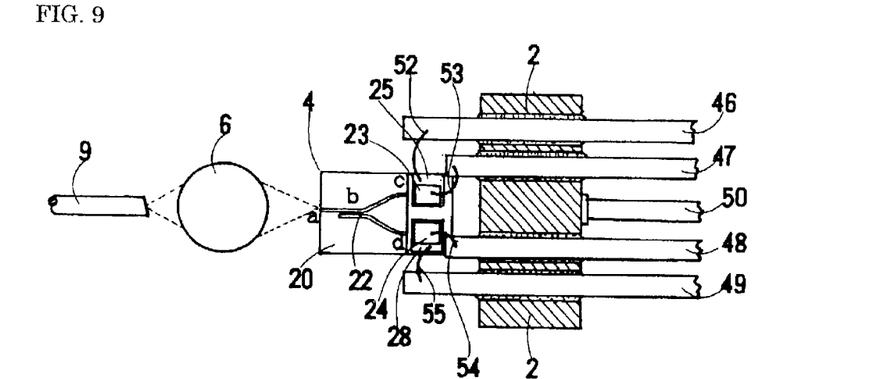
FIG. 9 is a vertical cross-sectional plan view showing a state in which the submodule having the Y-branching optical waveguide formed on the Si platform and the LD and PD provided at the trailing ends of the optical waveguide is mounted to the pole of the metal stem, lead pins at the stem are connected to metallized patterns and electrodes of the PD and LD, and these are aligned so that light from an optical fiber is focused exactly at the leading end of the Y-branching optical waveguide.
Figure 10:
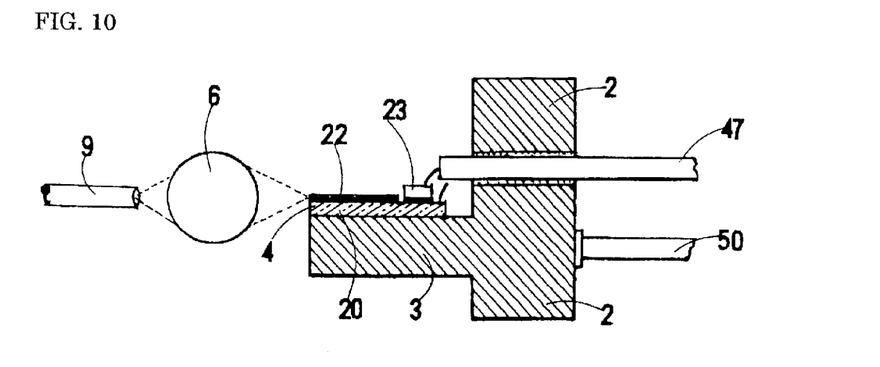
FIG. 10 is a vertical cross-sectional side view of the structure shown in FIG. 9, including the optical fiber, a lens, the submodule, and the stem.

4. Wire Bonding of Lead Pins, Metallized Patterns, LD, and PD (FIGS. 9 and 10)

The LD chip and PD chip, and the metallized patterns holding them are vertically provided at the stem surface, which causes some difficulty to perform wire bonding. Wire bonding cannot be carried out from the top surface of the stem, so the wire bonding must be carried out from a side of the stem. This can be achieved by holding the stem surface so that it is oriented vertically, and by holding the pole surface so that it is oriented upward. In the case where they are held in this manner, it is also difficult to carry out wire bonding if the heights of the lead pins vary considerably.

To overcome this problem, the heights of the lead pins 46 to 49 should be made the same. That is, as shown in FIGS. 9 and 10, the four lead pins 46 to 49 are disposed at the bottom surface of the stem, side by side in the same plane at right angles to the stem surface. In addition to the four lead pins 46 to 49, there is the case pin 50. Only the case pin 50 is free from such a restriction, so it may be disposed at a suitable place in a balanced manner. If these lead pins are at about the same height, and the n electrodes (seen on the top surfaces) of the PD and LD are disposed slightly below the lead pins, wire bonding can be carried out easily. In FIG. 9, although the PD and LD and the lead pins are at different heights, if the lead pins are slightly displaced, the six surfaces can be disposed at the same height.

The lead pin 46 and the metallized pattern 25 are connected with a wire 52. The lead pin 47 and the electrode (n electrode) on the top surface of the LD 23 are connected with a wire 53. In this example, the lead pin 46 is an anode pin of the LD and the lead pin 47 is a cathode pin.

The lead pin 48 and the electrode (n electrode) on the top surface of the PD 24 is connected with a wire 54. The lead pin 49 and the metallized pattern 28 are connected with a wire 55. In this example, the lead pin 48 is a cathode pin of the PD and the lead pin 49 is an anode pin.

In this way, since the submodule is vertically attached to the pole, wire bonding is no longer carried out in the usual direction of the stem surface. While at first seemingly difficult, horizontal wire bonding can be carried out in a direction parallel to the stem surface in order to connect the light emitting device and light receiver device to lead pins, respectively.

Figure 11:
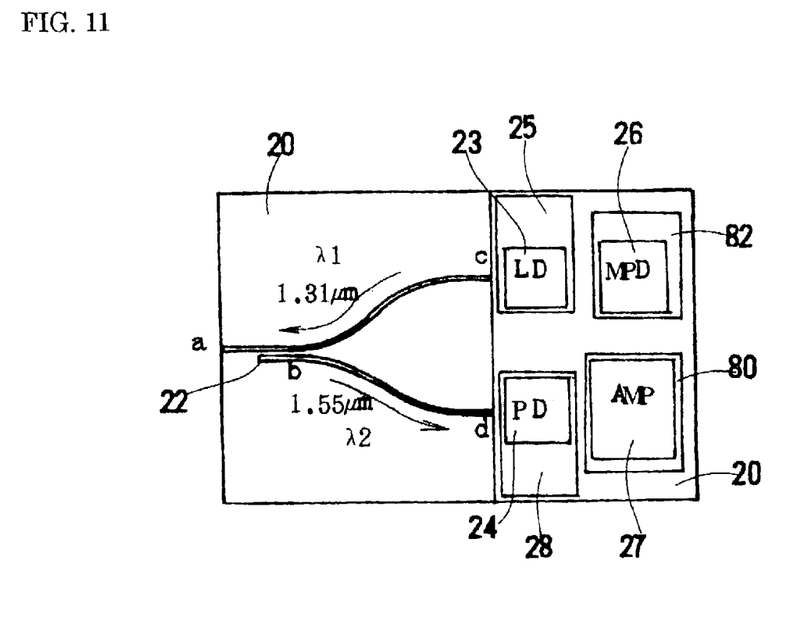
FIG. 11 is a plan view of a submodule in which a Y-branching optical waveguide is provided on an Si platform and an LD and a PD are separately disposed at the trailing ends of the optical waveguide, and a monitor photodiode MPD is disposed behind the LD and a preamplifier AMP is disposed behind the PD such that the submodule can be mounted to a pole of a metal stem.
Figure 12:
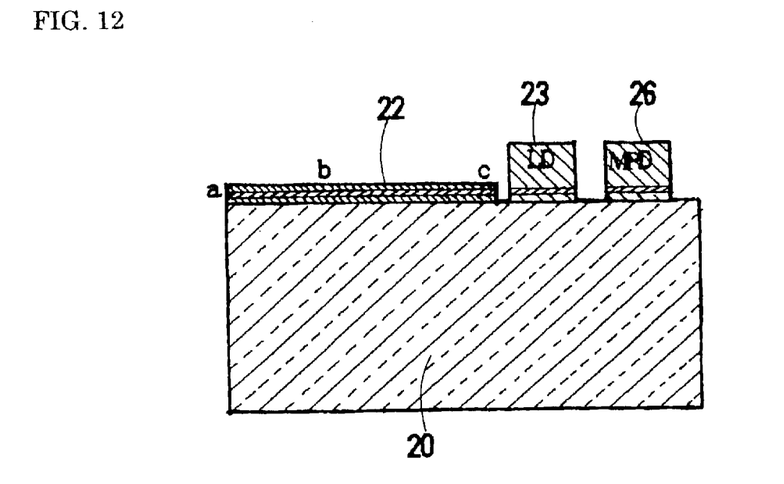
FIG. 12 is a sectional view of the structure shown in FIG. 10.

5. Addition of Peripheral Devices (Monitor Photodiode MPD; Pre-Amplifier AMP) (FIGS. 11 and 12)

Peripheral devices for assisting the operations of the PD and LD may also be provided in the submodule. FIGS. 11 and 12 illustrate a submodule including such peripheral devices. A Y-branching optical waveguide 22 is disposed at the front portion of an Si bench 20, and an LD 23 and a PD 24 are mounted on metallized patterns beyond trailing ends c and d.

Here, a metallized pattern 82 is disposed behind the LD 23, and a monitor photodiode (MPD) 26 is mounted on top of the metallized pattern 82. The monitor photodiode 26 is provided for adjusting LD drive current so that output from the LD is kept at a specified level by monitoring light behind the LD 23.

A metallized pattern 80 is provided behind the PD 24, and a preamplifier (AMP) 27 is mounted on top of the metallized pattern 80. The preamplifier 27 preamplifies very weak photocurrent from the PD 24.

When the peripheral devices are provided, five additional lead pins are used. Since 5 lead pins are used when the peripheral devices are not provided, 10 lead pins are used so as to hang downward from the lower surface of the stem.

6. Third Embodiment (Linear Waveguide Not Having a Branching Portion, Multiple Layer Filter, and Rear Illuminated Type PD; FIGS. 14 to 17)

Figure 14:
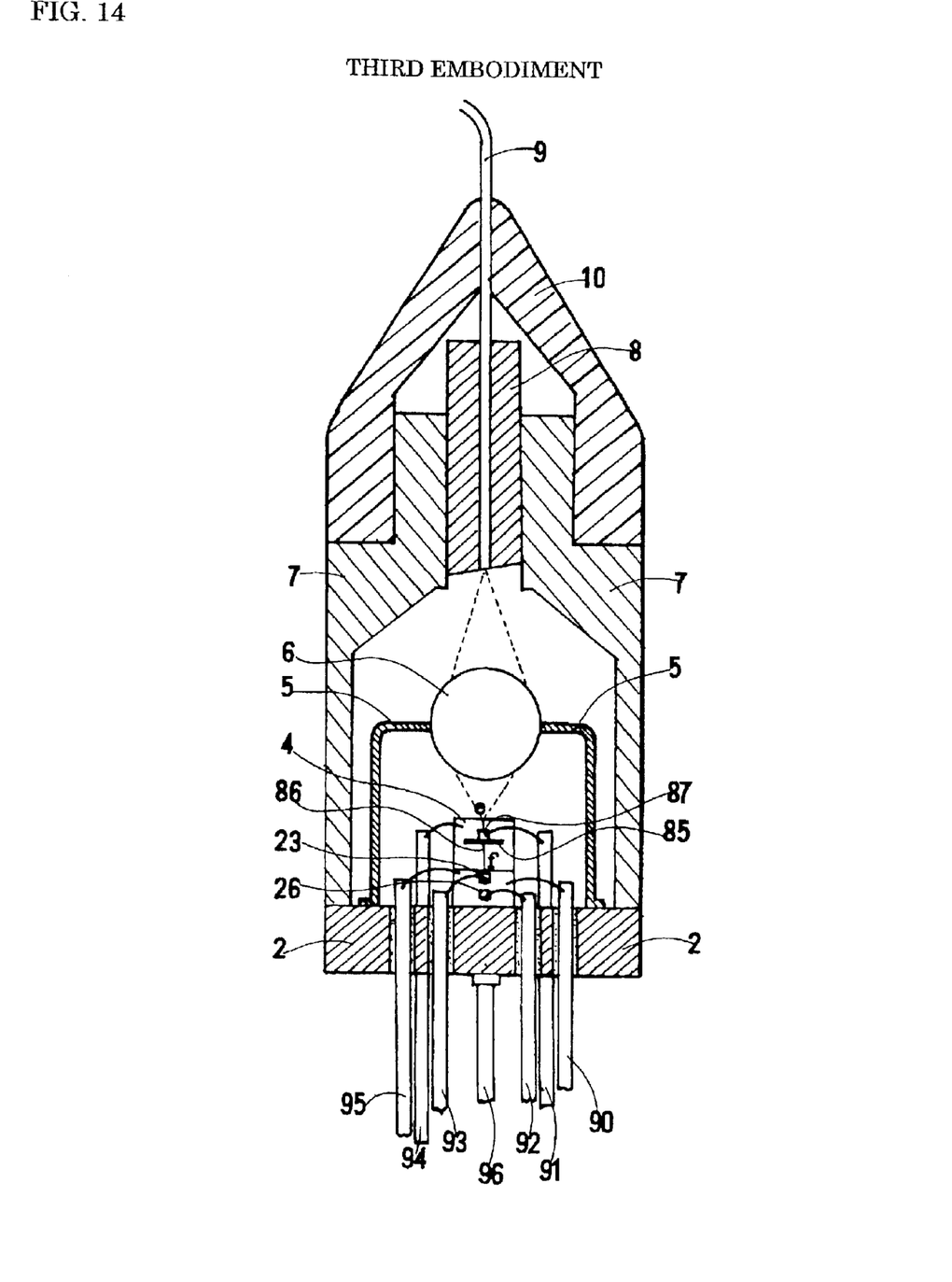
FIG. 14 is a vertical cross-sectional front view of an optical transceiver module of a third embodiment of the present invention in which an oblique groove is formed in the middle of one optical waveguide without any branching portion and a multiple layer filter having wavelength selectivity is inserted in the oblique groove.
Figure 15:
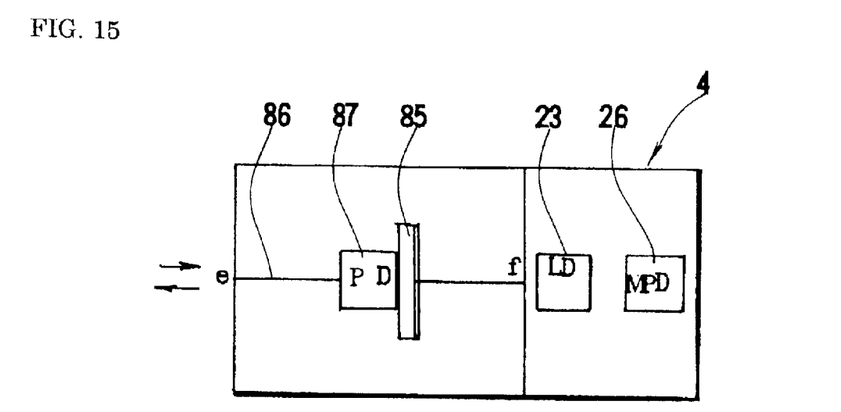
FIG. 15 is a plan view of a submodule of the structure shown in FIG. 14.
Figure 16:
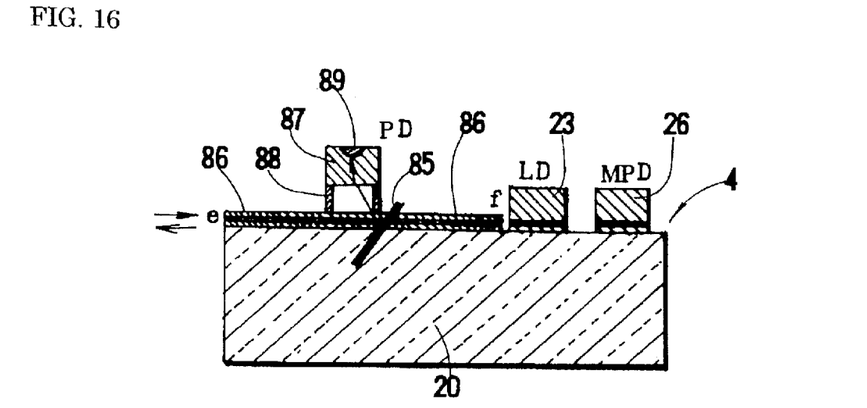
FIG. 16 is a sectional view of the submodule of the structure shown in FIG. 14.
Figure 17:
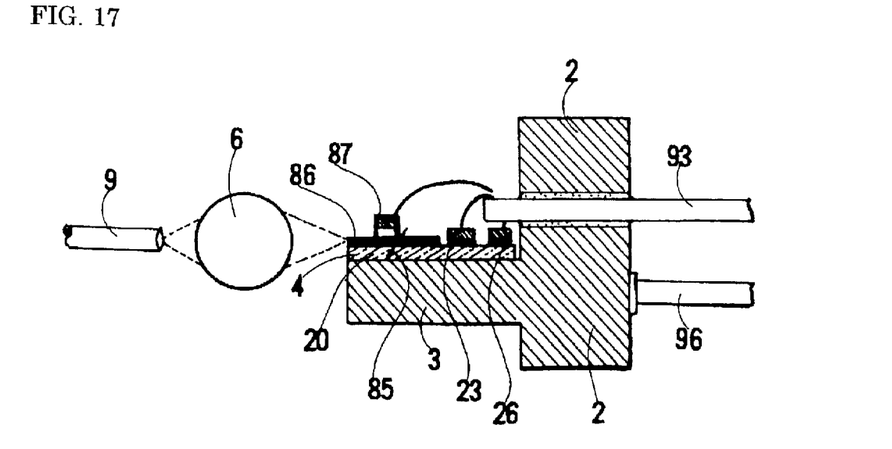
FIG. 17 is a sectional view of a portion of the structure shown in FIG. 14, including an optical fiber, a lens, a submodule, and a stem.

Although, in the foregoing description, a Y-branching optical waveguide is used, the present invention is not limited to the embodiments using a Y-branching optical waveguide. FIG. 14 is a vertical sectional view of a third embodiment of the present invention in which an oblique groove is formed in the middle of one optical waveguide 86 without any branching portion and a multiple layer filter 85 having wavelength selectivity is inserted in the oblique groove. FIG. 15 is a plan view of a submodule thereof. FIG. 16 is a vertical sectional view of the submodule. FIG. 17 is a vertical sectional view of a portion including an optical fiber, a lens, the submodule, and a stem.

Instead of disposing a transmitting section and a receiver section separating at the left and right sides on the submodule, they are disposed in a straight line. As shown in FIG. 14, lead pins 90 to 96 are joined to metallized patterns for the transmitting section and the receiver section by wire bonding.

Transmission light from an LD 23 enters an end face f of the optical waveguide 86 not having a branching portion, is transmitted through the multiple layer filter 85, passes through the other end face e, and is focused onto an optical fiber 9 by a lens 6. On the other hand, reception light entering a submodule 4 from the optical fiber 9 enters the optical waveguide 86 from the end surface e of the submodule 4, is reflected by the multiple layer filter 85, passes through an opening in a submount 88, enters a rear illuminated type PD 87, is received by a light receiver section 89, and is converted into electric signals.

By mounting the submodule in a package as shown in FIG. 14, it is possible to provide the same functions and same features as those in the case where a Y-branching optical waveguide is used.

Figure 13:
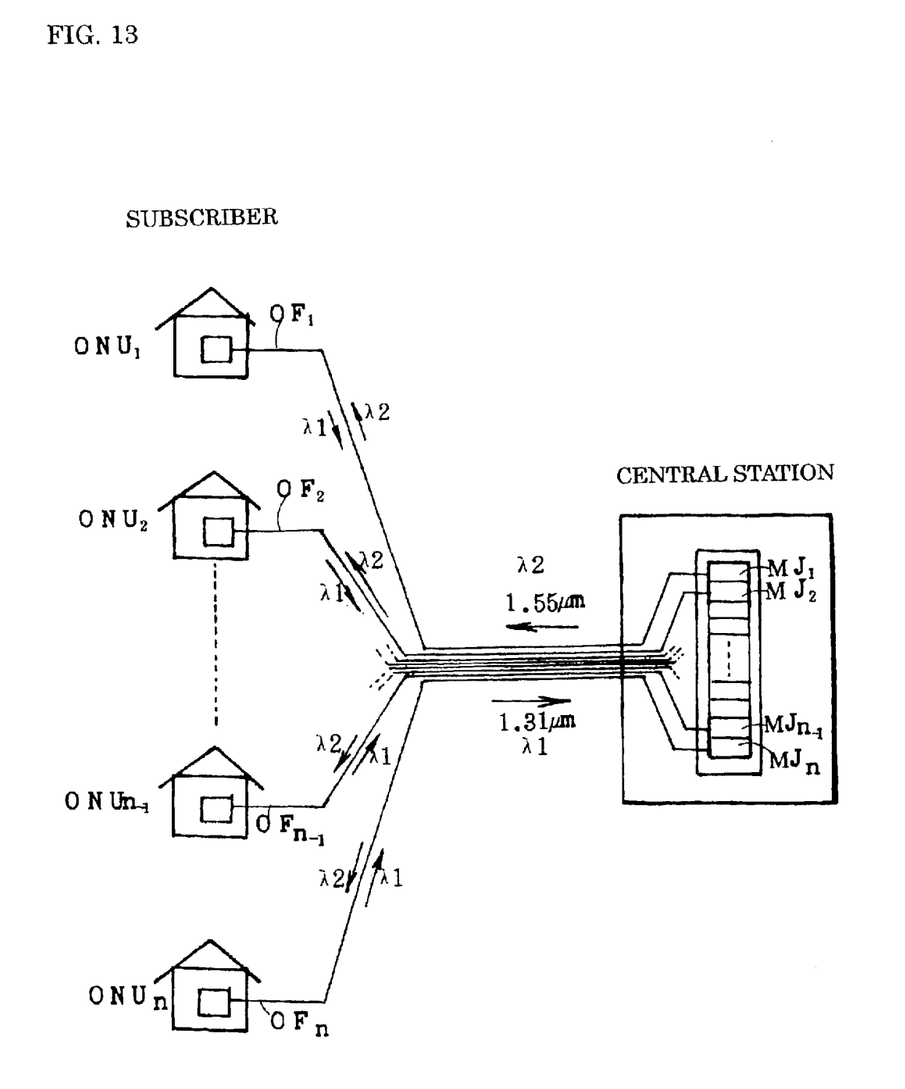
FIG. 13 is a schematic view for illustrating a single-fiber bi-directional optical communication system in which N-number (N is an integer of two or more) of subscribers each having an optical transceiver module and one central station having N-number of optical transceiver modules are connected by N-number of optical fibers so as to allow independent bi-directional communications between the subscribers and the central station.

7. Single-fiber Bi-Directional Optical Communications System Using a Metal-Package-Type Optical Transceiver Module (FIG. 13)

When N-number of metal-package-type optical transceiver modules of the present invention are used, a bi-directional optical communications system including N-number of subscribers and one central station can be constructed. In FIG. 13, N-number of subscribers $ONU_1$, $ONU_2$, ..., $ONU_{n-1}$, $ONU_n$ are indicated on the left side. Each subscriber has one optical transceiver module. Each subscriber has one optical fiber OF extending towards the central station.

At the central station, N-number of optical transceiver modules $MJ_1$, $MJ_2$, ..., $MJ_{n-1}$, and $MJ_n$ are disposed according to the number of subscribers. A kth subscriber $ONU_k$ and a kth optical transceiver module $MJ_k$ are independently connected by an associated kth optical fiber $OF_k$. A downward system from the central station to the subscribers use optical signals having a wavelength of $\lambda 2$ (1.55 $\mu$m), whereas an upward system from the subscribers to the central station uses optical signals having a wavelength of $\lambda 1$ (1.31 $\mu$m).

Therefore, each optical transceiver module of the subscriber ONU comprises a PD for receiving light having a wavelength of $\lambda 2$ (1.55 $\mu$m), and an LD for emitting light having a wavelength of $\lambda 1$ (1.31 $\mu$m). These optical transceiver modules of the subscribers ONU are optical transceiver modules illustrated in FIGS. 6 and 7.

In contrast, each optical transceiver module $MJ_k$ at the central station is a combination of a PD for receiving light having a wavelength of $\lambda 1$ (1.31 $\mu$m) and an LD for emitting light having a wavelength of $\lambda 2$ (1.55 $\mu$m). Accordingly, the present invention may be applied to the optical transceiver modules at the central station and the subscribers.

In either case, the volume of the module is approximately halved compared to a conventional metal-package-type module, so the module can be more easily disposed, and costs are reduced. In addition, the module can fully provide the advantages of a metal-package-type module, such as having a long life, high reliability, and airtightness. Accordingly a suitable optical communications system can be provided.

What is claimed is:

1. An optical transceiver module comprising:

a submodule comprising a platform, a Y-branching optical waveguide disposed thereon, a light receiver device, and a light emitting device, the Y-branching optical waveguide having wavelength selectivity, with its leading end exposed at the front surface of the platform and two trailing ends c and d thereof being branched at a branching portion, for separating wavelengths into a first wavelength $\lambda 1$ and a second wavelength $\lambda 2$, the light receiver device for receiving the second wavelength $\lambda 2$ being disposed on the platform so as to oppose and to be close to a first trailing end of the optical waveguide, the light emitting device for generating the first wavelength $\lambda 1$ being disposed on the platform so as to oppose and to be close to a second trailing end of the optical waveguide;

a plurality of lead pins extending in an axial direction;

a disk-shaped metal stem having an upwardly protruding pole, the stem holding the submodule at a surface of the pole;

an optical fiber whose end is secured relative to the stem;

a lens for optically coupling the optical fiber and the leading end of the Y-branching optical waveguide;

a cap secured on the stem and holding the lens; and a supporting member secured to the stem and holding the optical fiber.

2. An optical transceiver module according to claim 1, wherein the lead pins to be connected to the light receiver device and the light emitting device are disposed within a plane that is perpendicular to a surface of the stem.

3. An optical transceiver module according to claim 1, wherein the light receiver device and the light emitting device are connected to the lead pins, respectively by wire bonding carried out in a direction parallel to a surface of the stem, a wire being connected to a side surface of each lead pin.

4. An optical transceiver module according to claim 1, wherein the module is a pigtail-type, an end portion of the optical fiber being held by a circular cylindrical ferrule, the ferrule being held by a circular cylindrical metal ferrule holder, and the ferrule holder being axially aligned and secured to a surface of the stem.

5. An optical transceiver module according to claim 1, wherein the module is a receptacle-type module pluggable to an external male optical connector;

a circular cylindrical metal sleeve having an opening in the center is secured on the disk-shaped metal stem;

a metallic housing having an opening in the center is secured to the top of the sleeve such that a female connector is formed by inserting a stub holding a dummy optical fiber into the center opening of the housing so that a ferrule holding an optical fiber can be held and the external male optical connector can be mounted to and dismounted from a portion surrounding the opening.

6. An optical transceiver module according to claim 1, further comprising a preamplifier, disposed on a surface of the platform of the submodule, for amplifying photocurrent from the light receiver device.

7. An optical transceiver module according to claim 1, further comprising a monitor photodiode, disposed on a surface of the platform of the submodule, for monitoring power of the light emitting device.

8. An optical communications system comprising:

N-number (N is an integer of two or more) of subscribers each having the optical transceiver module of claim 1;

a station having N-number of optical transceiver modules of claim 1, wherein the light receiver device is designed to receive the first wavelength $\lambda 1$ instead of the second wavelength $\lambda 2$, and the light emitting device is designed to generate the second wavelength $\lambda 2$ instead of the first wavelength $\lambda 1$; and N-number of optical fibers for connecting the N-number of subscribers and the N-number of optical transceiver modules of the station.

9. An optical transceiver module comprising:

a submodule comprising a platform, a waveguide disposed on the platform with the leading end "e" thereof being exposed at the front surface of the platform, a groove disposed in the middle of the waveguide, a multiple layer filter inserted in the groove and having wavelength selectivity for transmitting a first wavelength $\lambda 1$ and reflecting a second wavelength $\lambda 2$, a light receiver device for receiving the second wavelength $\lambda 2$, the light receiver device being disposed above the platform so as to be close to and to oppose the multiple layer filter, and a light emitting device for generating the first wavelength $\lambda 1$, the light emitting device being disposed on the platform so as to be close to and to oppose the trailing end "f" of the optical waveguide;

a plurality of lead pins extending in an axial direction;

a disk-shaped metal stem having an upwardly protruding pole for holding the submodule at a surface thereof;

an optical fiber, the end thereof being secured relative to the stem;

a lens for optically coupling the optical fiber and the leading end "e" of the optical waveguide;

a cap secured to the stem and holding the lens; and a supporting member secured to the stem and holding the optical fiber.

10. An optical transceiver module according to claim 9, wherein the lead pins to be connected to the light receiver device and the light emitting device are disposed within a plane that is perpendicular to a surface of the stem.

11. An optical transceiver module according to claim 9, wherein the light receiver device and the light emitting device are connected to the lead pins, respectively by wire bonding carried out in a direction parallel to a surface of the stem, a wire being connected to a side surface of each lead pin.

12. An optical transceiver module according to claim 9, wherein the module is a pigtail-type, an end portion of the optical fiber being held by a circular cylindrical ferrule, the ferrule being held by a circular cylindrical metal ferrule holder, and the ferrule holder being axially aligned and secured to a surface of the stem.

13. An optical transceiver module according to claim 9, wherein the module is a receptacle-type module pluggable to an external male optical connector;

a circular cylindrical metal sleeve having an opening in the center is secured on the disk-shaped metal stem;

a metallic housing having an opening in the center is secured to the top of the sleeve such that a female connector is formed by inserting a stub holding a dummy optical fiber into the center opening of the housing so that a ferrule holding an optical fiber can be held and the external male optical connector can be mounted to and dismounted from a portion surrounding the opening.

14. An optical transceiver module according to claim 9, further comprising a preamplifier, disposed on a surface of the platform of the submodule, for amplifying photocurrent from the light receiver device.

15. An optical transceiver module according to claim 9, further comprising a monitor photodiode, disposed on a surface of the platform of the submodule, for monitoring power of the light emitting device.

16. An optical communications system comprising:

N-number (N is an integer of two or more) of subscribers each having the optical transceiver module of claim 2;

a station having N-number of optical transceiver modules of claim 2, wherein the multiple layer filter is designed to transmit the second wavelength $\lambda 2$ instead of the first wavelength $\lambda 1$ and to reflect the first wavelength $\lambda 1$ instead of the second wavelength $\lambda 2$, and the light receiver device is designed to receive the first wavelength $\lambda 1$ instead of the second wavelength $\lambda 2$, and the light emitting device is designed to generate the second wavelength $\lambda 2$ instead of the first wavelength $\lambda 1$; and N-number of optical fibers for connecting the N-number of subscribers and the N-number of optical transceiver modules of the station.

* * * * *